United States Patent [19]

Mori et al.

[11] Patent Number: 5,071,787
[45] Date of Patent: Dec. 10, 1991

[54] SEMICONDUCTOR DEVICE UTILIZING A FACE-DOWN BONDING AND A METHOD FOR MANUFACTURING THE SAME

[75] Inventors: Miki Mori, Kawasaki; Masayuki Saito, Yokohama, both of Japan

[73] Assignee: Kabushiki Kaisha Toshiba, Kawasaki, Japan

[21] Appl. No.: 477,504

[22] Filed: Feb. 9, 1990

[30] Foreign Application Priority Data

Mar. 14, 1989 [JP] Japan .................................. 1-61634
Jun. 26, 1989 [JP] Japan ................................ 1-163196

[51] Int. Cl.$^5$ .......................................... H01L 21/44
[52] U.S. Cl. ................................... 437/183; 437/212; 437/209; 437/213
[58] Field of Search ............... 437/183, 212, 213, 209, 437/211; 228/180.2, 188

[56] References Cited

U.S. PATENT DOCUMENTS

| | | | |
|---|---|---|---|
| 3,531,852 | 10/1970 | Slemmons et al. | 29/470.1 |
| 3,680,198 | 8/1972 | Wood | 437/183 |
| 4,494,688 | 1/1985 | Hatada | 228/188 |
| 4,693,770 | 9/1987 | Hatada | 228/188 |
| 4,749,120 | 6/1988 | Hatada | 228/180.2 |
| 4,784,972 | 11/1988 | Hatada | 437/209 |
| 4,876,221 | 10/1989 | Hatada | 437/212 |

FOREIGN PATENT DOCUMENTS

| | | | |
|---|---|---|---|
| 0262580 | 4/1988 | European Pat. Off. | |
| 0089368 | 8/1978 | Japan | 437/183 |
| 0111127 | 8/1980 | Japan | 437/183 |
| 0034041 | 2/1985 | Japan | 437/183 |
| 0198738 | 9/1986 | Japan | 437/183 |
| 0058947 | 3/1988 | Japan | 437/183 |
| 0122155 | 5/1988 | Japan | 437/183 |
| 0306634 | 12/1988 | Japan | 437/183 |
| WO89/02653 | 3/1989 | PCT Int'l Appl. | |
| 2201545 | 9/1988 | United Kingdom | 437/183 |

OTHER PUBLICATIONS

Patent Abstracts of Japan, vol. 12, No. 369 (E-665), Oct. 4, 1988; & JP-A-63 122 155, (Matsushita Electric Ind. Co., Ltd.), 05/26/88.

*Primary Examiner*—Brian E. Hearn
*Assistant Examiner*—Trung Dang
*Attorney, Agent, or Firm*—Oblon, Spivak, McClelland, Maier & Neustadt

[57] ABSTRACT

In a semiconductor device including a substrate having a wiring layer formed on its major surface and a semiconductor element having an electrode formed on its major surface in which a face-down bonding is achieved with the major surface of the semiconductor element oppositely facing that major surface of the semiconductor substrate which is located opposite to the electrode on the semiconductor element, first bumps formed of gold are formed on the electrode of the semiconductor element, second bumps formed of an indium/tin alloy are formed on the first bumps and an electrical and mechanical bond is achieved, by the second bumps, between the first bumps and the wiring layer in which case the second bumps are heated to an extent not exceeding the melting point of the second bumps.

7 Claims, 6 Drawing Sheets

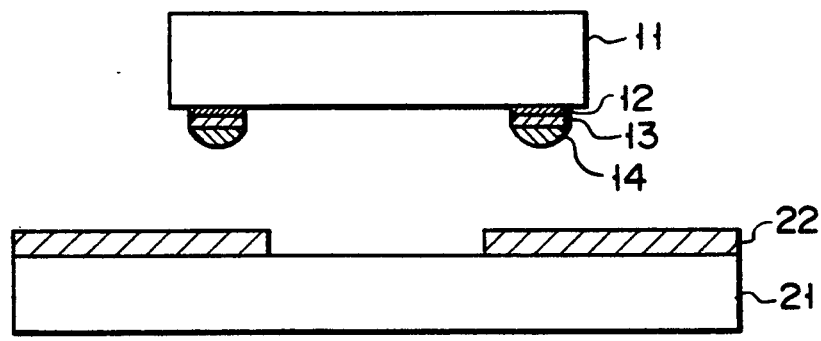
F I G. 1A
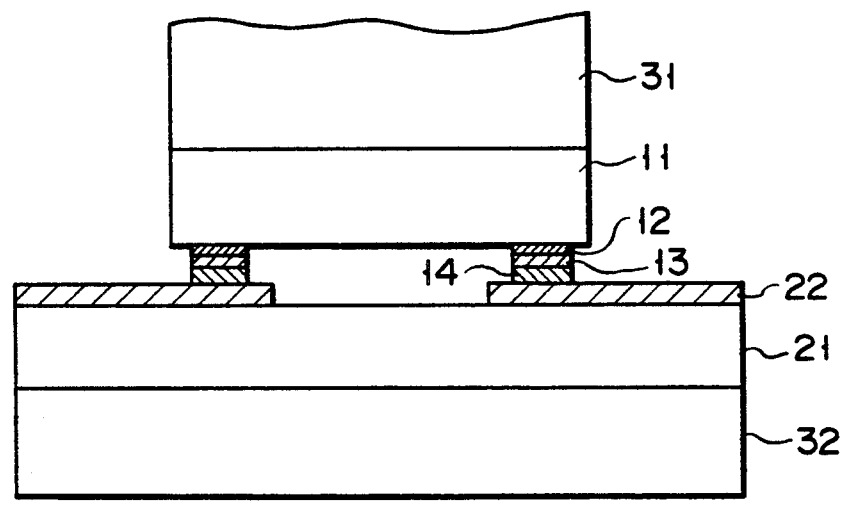
F I G. 1B
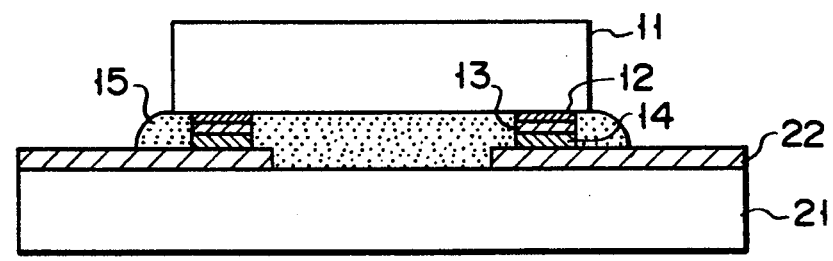
F I G. 1C

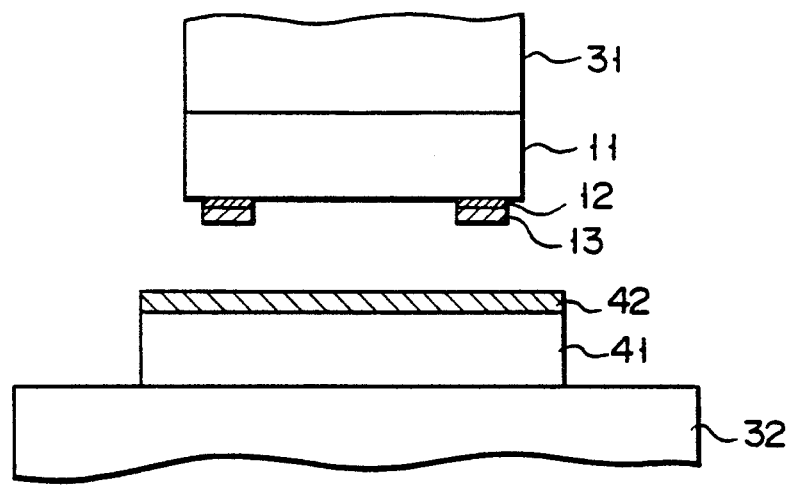
F I G. 2A
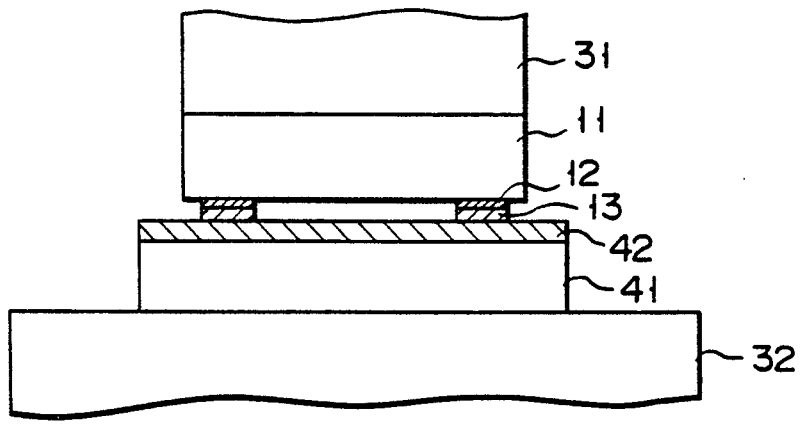
F I G. 2B
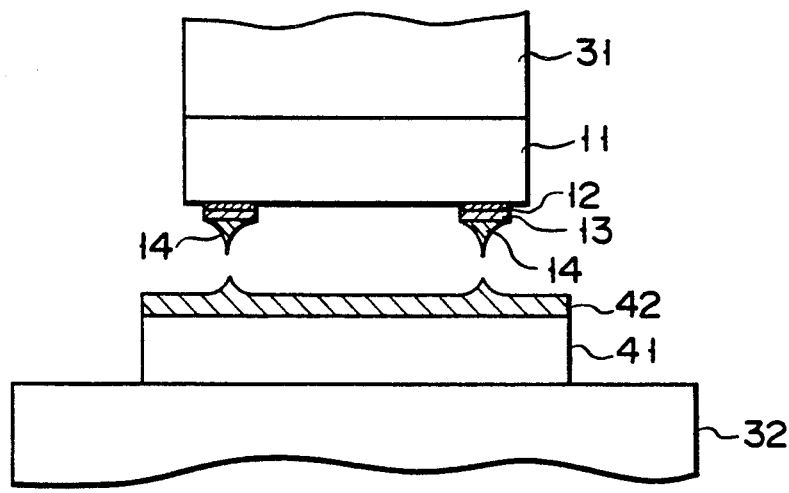
F I G. 2C

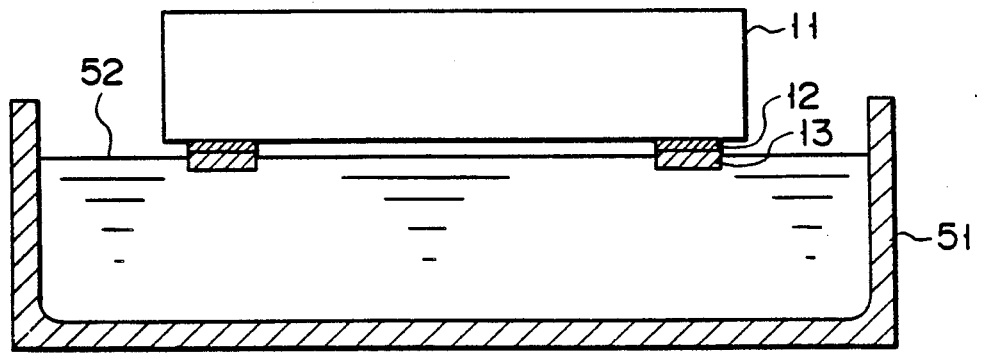
F I G. 3A
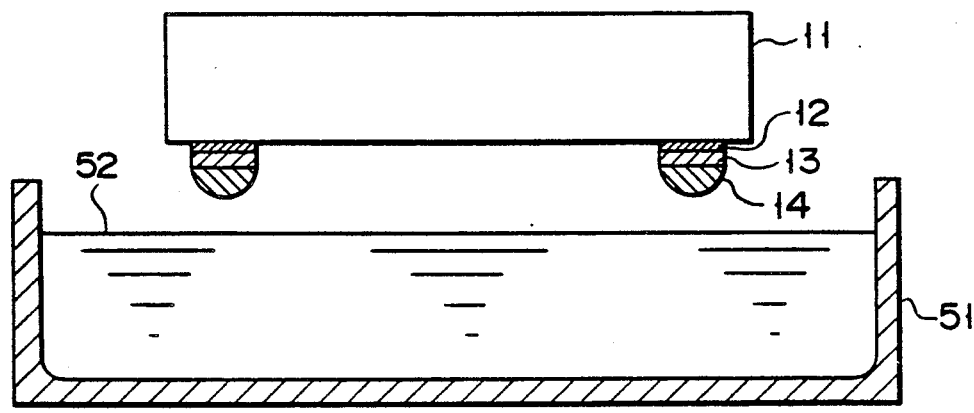
F I G. 3B

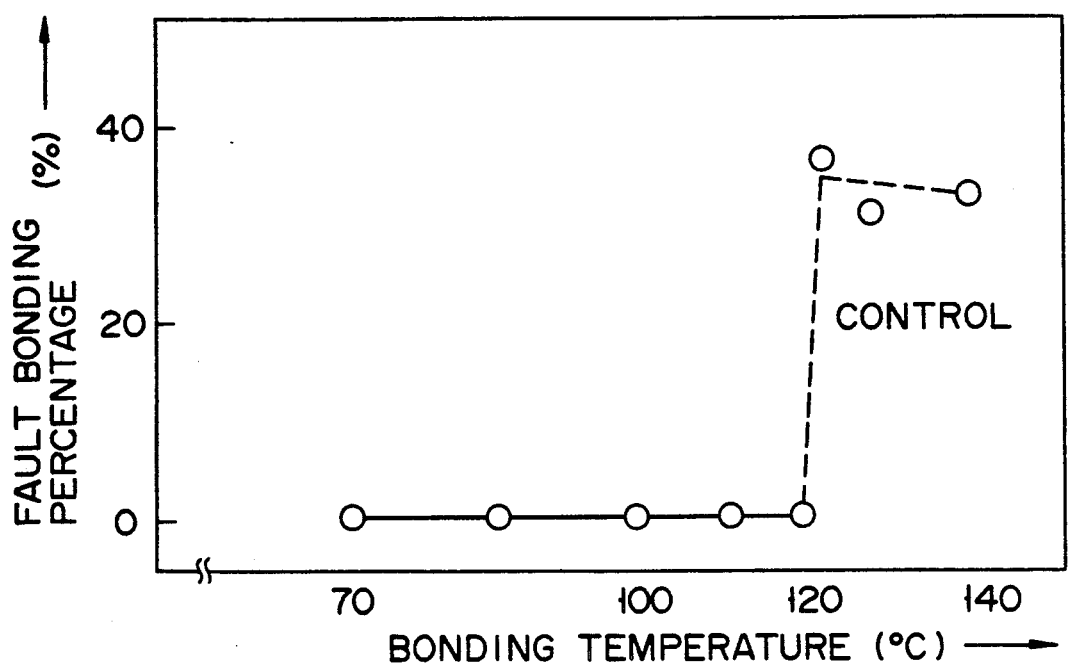
F I G. 4
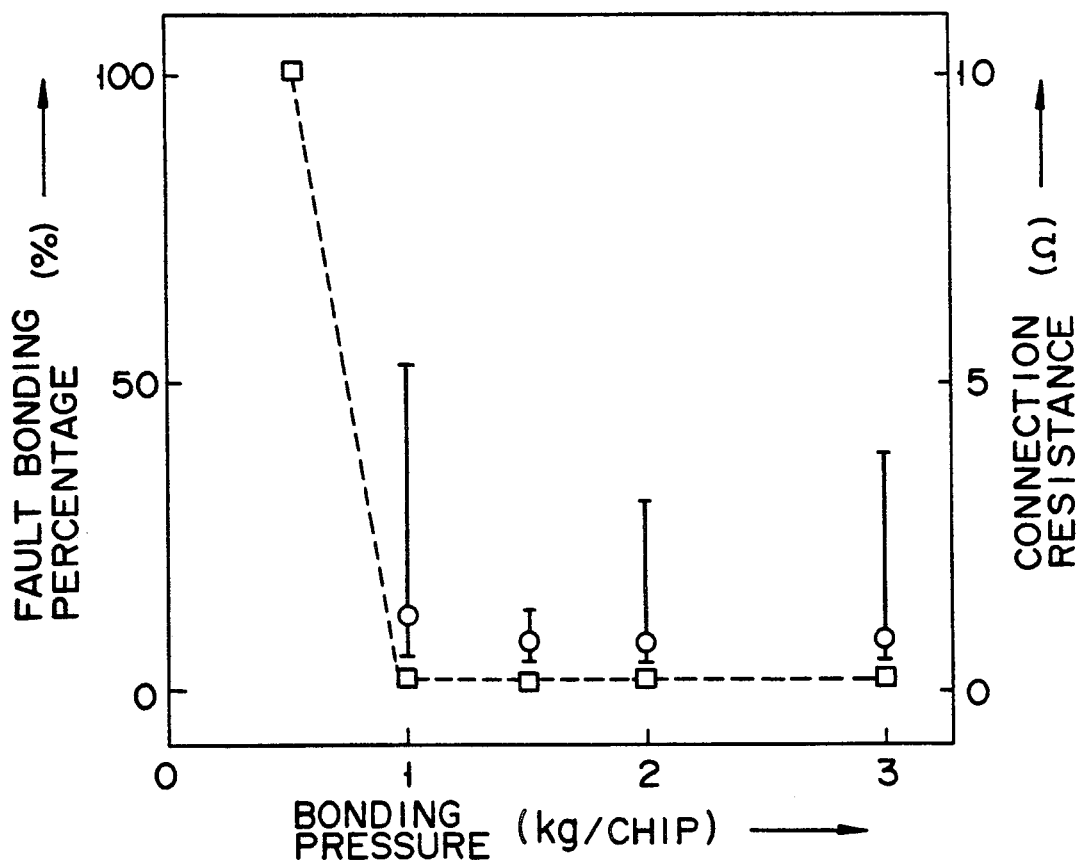
F I G. 5

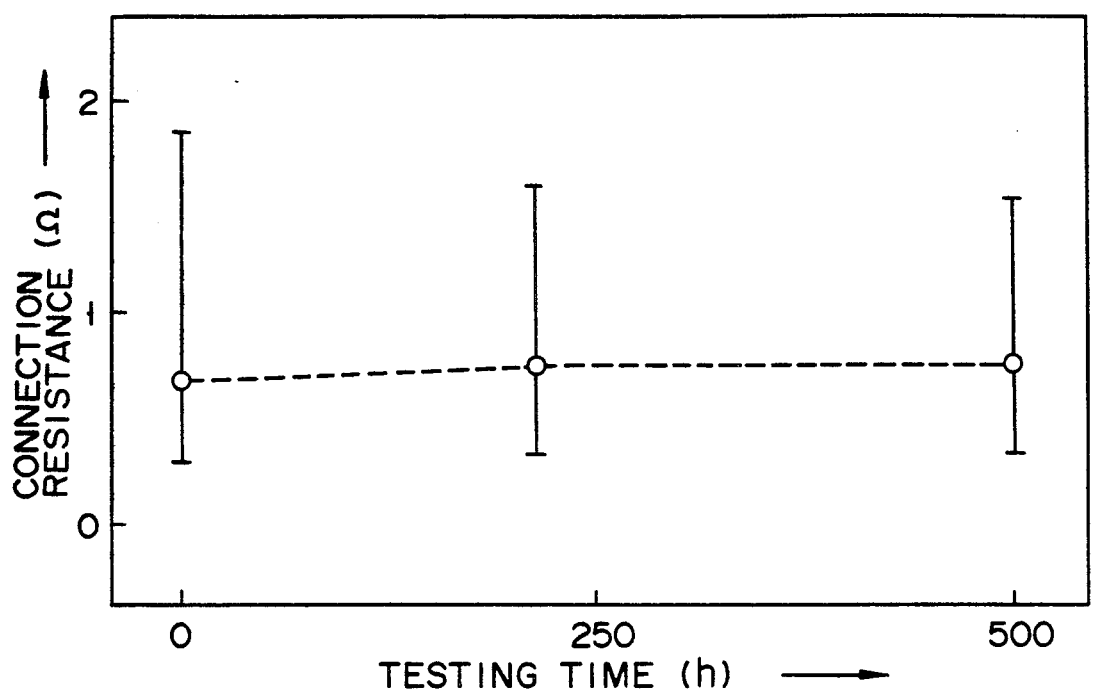
F I G. 6A
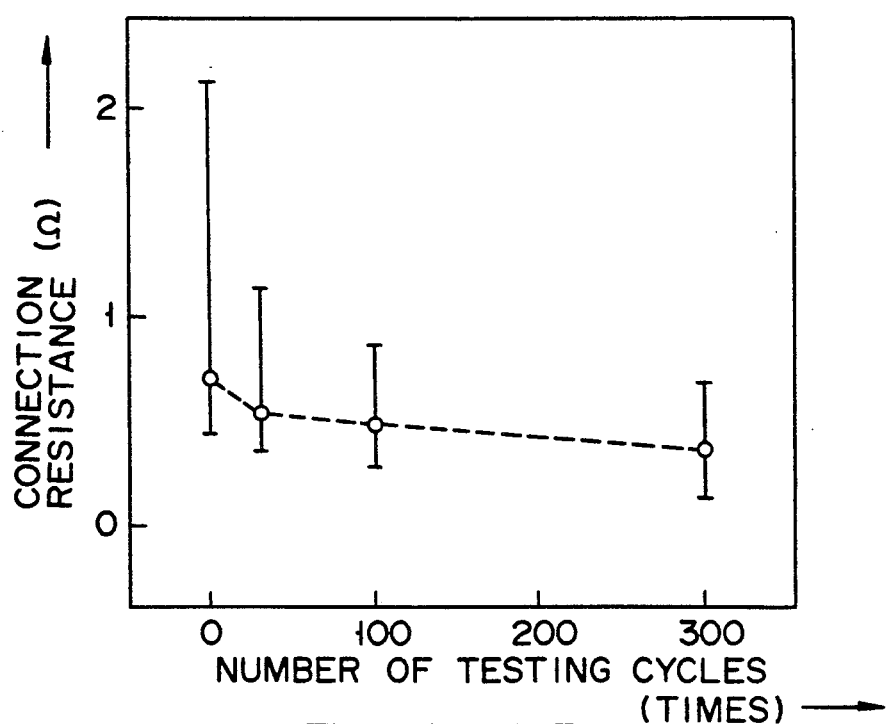
F I G. 6B

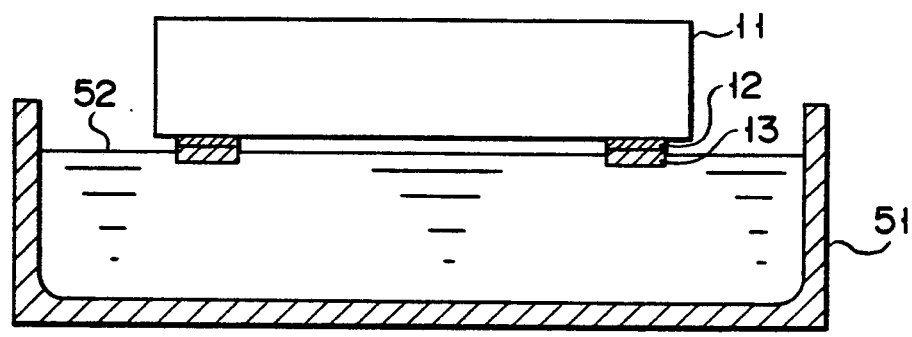
F I G. 7A
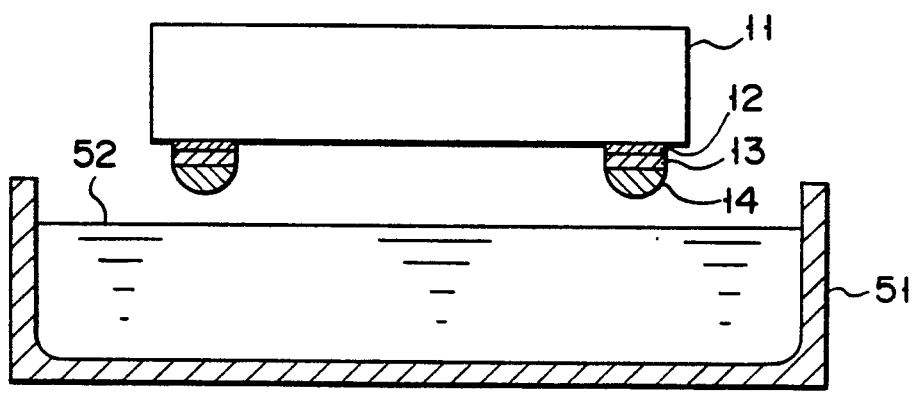
F I G. 7B
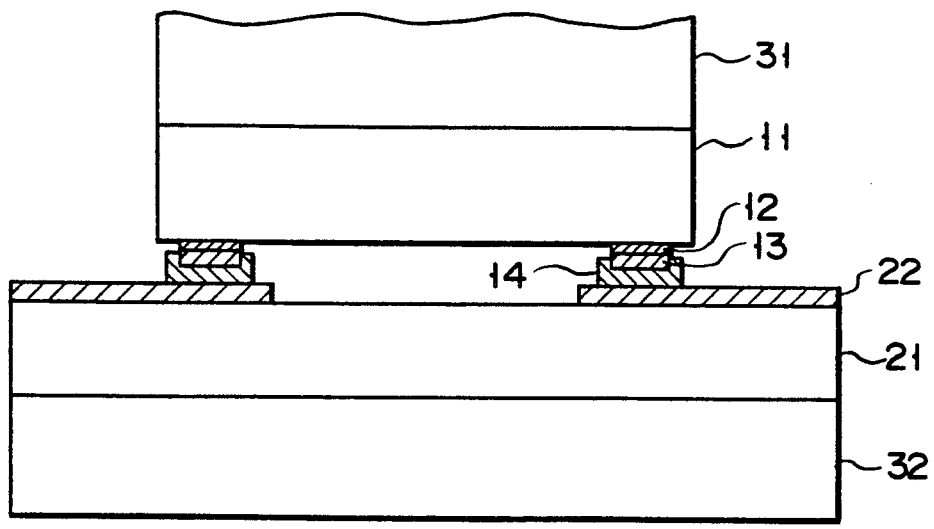
F I G. 7C

SEMICONDUCTOR DEVICE UTILIZING A FACE-DOWN BONDING AND A METHOD FOR MANUFACTURING THE SAME

BACKGROUND OF THE INVENTION

1. Field of the Invention

The present invention relates to a semiconductor device for mounting a semiconductor element on a substrate by a face-down bonding and a method for manufacturing the same.

2. Description of the Related Art

A recently advanced semiconductor manufacturing technique achieves a semiconductor element having over 100 electrode terminals. In the achievement of the semiconductor element, there is a growing demand for the technique of effectively bonding the electrode terminals of a high integration density semiconductor element to a wiring layer which is formed on an insulating substrate.

Japanese Patent Disclosure (KOKAI) Nos. 62-132331 and 62-169433 disclose the face-bonding technique for bonding a large number of electrodes of a semiconductor element, all at a time, on a wiring layer which is formed on a substrate. In these Disclosures (KOKAI), subsequent to coating a resin on a wiring layer-equipped substrate, bumps which are formed on the electrode of the semiconductor element are placed on the wiring layer in an aligned fashion, and the resin is cured while pressing the semiconductor element against the substrate side to obtain a bond between the bumps on the semi-conductor element side and the wiring layer on the substrate.

However, the aforementioned methods have encountered the following problems. That is, since an electrical/mechanical bond is achieved between the bumps on the semiconductor element and the wiring layer on the substrate after the resin has been cured, if pressing the semiconductor element against the substrate is stopped prior to curing the resin, then there is a possibility that there will be no conduction between the bumps and the wiring layer due to a regaining action of the resin. Further, no conduction is caused due to the penetration of the resin per se into a spot between the bumps and the wiring layer. Such a pressing step cannot be released prior to curing the resin and it is necessary to, subsequent to aligning the bumps with the wiring layer, continue the pressing operation until the resin is cured. Since, therefore, a high-cost mounter equipped with the position aligning mechanism requires a longer operation time, a poor productivity results. In the event of the occurrence of semiconductor element faults or mount faults, the resin which has once been cured has to be removed from the bonding site for replacement by a normal semiconductor element. It is, thus, very difficult to repair the defective semiconductor device.

Since, in the prior art, the semiconductor element is face-down bonded on the substrate subsequent to curing the resin, no adequate electrical bond is obtained between the electrode on the semiconductor element and the wiring layer on the substrate and hence a bond is effected with less reliability. The conventional method requires continuing a pressing operation until the resin is cured and also removing the resin from the deposited site for replacement by a semiconductor element. It is, therefore, very difficult to make repairs.

SUMMARY OF THE INVENTION

It is accordingly the object of the present invention to provide a semiconductor device and a method for manufacturing the same, which can mount a semiconductor element on a substrate to provide a firm bond between an electrode on the semiconductor element and a wiring layer on the substrate with high reliability and can ensure the ease with which the semiconductor element is replaced with another semiconductor element.

According to one embodiment of the present invention, there is provided a semiconductor device including a substrate having a wiring layer formed on its major surface and a semiconductor element having an electrode formed on its major surface, in which first bumps formed of gold are formed on the electrode and second bumps formed of a metal containing indium are formed between the first bumps and the wiring layer to obtain an electrical/mechanical bond, by the second bumps, between the first bumps and the wiring layer.

According to another embodiment of the present invention, there is provided a semiconductor device including a substrate having a wiring layer formed on its major surface and a semiconductor element having an electrode formed on its major surface, in which first bumps are formed on the electrode and second bumps are formed between the first bumps and the wiring layer with the second bumps deposited around the side wall of the first bumps to provide an electrical/mechanical bond, by the second bumps, between the first bumps and the wiring layer.

In another aspect of the present invention, there is provided a method for manufacturing a semiconductor device which mounts an electrode-equipped semiconductor element on a wiring layer-equipped substrate with the major surface (the electrode-side surface) of the semiconductor element oppositely facing the major surface (the wiring layer-side surface) of the substrate, which comprises the steps of forming first bumps, such as gold, on the electrode on the semiconductor element; forming second bumps, such as a metal containing indium, on the first bumps; and heating the second bumps to an extent not exceeding the melting point of the second bumps, while pressing the semiconductor element against the substrate, to cause the second bumps to be brought into contact with the wiring layer on the substrate to obtain an electrical/mechanical bond between the first bumps and the wiring layer.

In the present invention, the first bumps formed on the electrode of the semiconductor element are bonded, by the second bumps, to the wiring layer on the insulating substrate at which time use is made of a heating temperature not exceeding the melting point of the second bumps. For this reason, the second bumps are plastically deformed to remove an oxide layer away from a bond site between the second bumps and the wiring layer to ensure a better electrical bond between the second bumps and the wiring layer and hence between the electrode formed on the semiconductor element and the wiring layer formed on the semiconductor substrate. Since, at this stage, the resin is not filled into a clearance between the semiconductor element and the substrate, if there occurs a mount fault or an element fault, it is only necessary to mechanically remove the semiconductor element from the bond site and the semiconductor element is easy to repair. Further, a resin is impregnated into the clearance between the semiconductor element and the substrate after a bond has been obtained at a bond site between the second bumps of the semiconductor element and the wiring layer of the substrate. By so doing, it is possible to obtain a bond between the semiconductor element and the substrate with added reliability.

Since the second bumps are bonded to the first bumps in a manner to be deposited around the side wall of the first bumps, it is possible to enhance the stability with which the first and second bumps are bonded and to reduce their contact resistance. Further, the second bumps can readily be formed on the first bumps by either dipping the second bumps into a molten metal containing indium, etc., or bringing the second bumps into contact with a sheet-like metal containing indium, etc.

BRIEF DESCRIPTION OF THE DRAWINGS

FIGS. 1A to 1C are cross-sectional views showing the steps of manufacturing a semiconductor device according to a first embodiment of the present invention;

FIGS. 2A to 2C are cross-sectional views showing the steps of forming second bumps on first bumps by a transfer method;

FIGS. 3A to 3B are cross-sectional views showing the steps of forming second bumps on first bumps by a dipping method;

FIG. 4 is a graph showing a relation of the bonding temperature of a semiconductor element and conductive wiring layer to a bond (connection) fault;

FIG. 5 is a graph showing a relation of a fault resistance percentage against a bonding pressure to a variation in a connection resistance;

FIG. 6A is a graph showing a relation of a variation in a connection resistance to a testing time and FIG. 6B is a graph showing a relation of a connection resistance to a testing time; and FIGS. 7A to 7C are cross-sectional views showing the steps of manufacturing a semiconductor device according to a second embodiment of the present invention.

DETAILED DESCRIPTION OF THE PREFERRED EMBODIMENTS

The embodiments of the present invention will be explained below with reference to the accompanying drawings.

FIGS. 1A to 1C are cross-sectional views showing a semiconductor device according to a first embodiment of the present invention. A semiconductor element 11 having an electrode 12 formed on its major surface and an insulating substrate (a wiring substrate) 21 having a conductive wiring layer 22 on its major surface is prepared as shown in FIG. 1A. First bumps 13 are formed on an electrode 12 which is provided on the semiconductor element 11. Second bumps 14 are formed on the first bumps 13.

The substrate 21 is placed on a support base 32 and the wiring layer 22 and second bump 14 are placed in contact with each other with the wiring layer 22 aligned with the second bumps 14 formed on the semiconductor element 11 as shown in FIG. 1B. In this state, the semiconductor element is pressed by a heating head 31 against the substrate 21 and the second bump 14 is heated to an extent not exceeding its melting point. A face-down bonding is achieved by so doing.

After the heating and pressing steps, a thermosetting resin 15 is impregnated into a clearance between the semiconductor element 11 and the substrate 21 and the thermosetting resin is heated to mount the semiconductor element 11 on the substrate 21 as shown in FIG. 1C. Here, as the substrate 21 use can be made of glass, ceramics, epoxy glass, metal core substrate (a substrate having a metal plate covered with an insulating layer), polyimide, paper phenol substrate, etc. As the conductive wiring layer, use can be made of nickel, copper, titanium, ITO, chromium, aluminum, molybdenum, tantalum, tungsten, gold or silver, or their metal alloy. The way of forming the wiring layer 22 includes, for example, a sputtering, an evaporation and a plating method. For example, a 1.1 mm-thick soda-lime glass is used as the substrate 21. After an about 100 Å-thick SiO$_2$ layer has been formed on the glass substrate, an indium tin oxide (ITO) layer is evaporated on the resultant structure to a thickness of 1000 Å and an electroless Ni-plating is performed on the surface of the resultant structure to form a 5000 Å-thick wiring layer 22.

The semiconductor element 11 has the electrode 12, such as an aluminum bonding pad, and two layers, that is, the bumps 13 and 14, are formed on the electrode 12. For example, Au, Ni, Cu and solder can be used for the first bump 13. Of these, Au is high in ductility, stable, and difficult to oxidize and suitable particularly for use as the first bump. Indium, tin, lead or silver or their alloy can be used as the second bump 14. The first bump 13 can be formed by forming a barrier layer and bonding layer on an aluminum bonding pad (electrode 12) by a thin-film forming process and PEP process and electroplating the surface of the resultant layer unit by a wet bumping method. Further, the so-called transfer bumping method can be used according to which a bump is formed on another support base in the same method as set out above and transferred to the semiconductor element side. According to the present invention, an Au bump was used as the first bump 13 which was formed by the wet bumping method. In this case, 99 bumps 85 μm × 85 μm ± 18 μm ± 2 μm high were employed at a minimum bump pitch of 130 μm.

The second bump 14 can be formed by the so-called dipping method or a transfer method, that is, by dipping part (first bump 13) of the semiconductor element 11 into a molten metal solution.

In the transfer method, a substrate 41 having a metal sheet 42 (containing indium, zinc, lead, silver, etc.) formed to a thickness of a few tens of μm is prepared as shown in FIG. 2A, and first bumps 13 are pressed against the metal sheet 42 with the semiconductor element 11 being heated, and held, as shown in FIG. 2B, for a few seconds through a few tends of seconds. Then the semiconductor element 11 is lifted up at which time sharp-pointed bumps (bumps 14) are formed on the first bumps 13 as shown in FIG. 2C.

In the dip method, the first bumps 13 on the side of the semiconductor element 11 are dipped into a molten metal 52, containing indium, tin, silver, etc., which is held in a container 51, as shown in FIG. 3A. Then as shown in FIG. 3B, the first bumps 13 are lifted off the molten metal 52, so that second bumps 14 are formed as bulbous bumps on the corresponding first bumps 13. It is to be noted that the second bumps 14 can be formed directly on a barrier metal, such as Ni, Ti and Au, with the use of the transfer method, the electroless method and the electrolitic plating method.

In this method, the second bumps 14 were formed, by the dipping method, with the use of an indium/tin alloy. At this time, a resin-based flux was coated on the surface of the semiconductor element 11, the first bumps (Au) 13 on the side of the semiconductor element 11 were dipped into a molten indium/tin alloy solution kept at 180° C. and washed with an organic solvent and second bumps 14 were formed on the first bumps (Au) 13. Although, here, the second bumps 14 have been explained as being formed on the side of the semiconductor element 11, the bumps 14 may equally be formed on the side of the wiring layer 22 by the same method as set forth above.

With the second bumps 14 on the side of the semiconductor element 11 aligned with the wiring layer 22 on the substrate 21, the semiconductor element 11 and substrate 21 can be jointed by pressing the second bumps 14 while heating them to an extent not exceeding their melting point. By so doing, the wiring layer 22 can be electrically and mechanically connected (bonded) to the semiconductor element 11. Since the second bumps 14 are plastically deformed under a proper action of pressure, oxides film on the surfaces of the wiring layer 22 and second bumps 14 are removed and hence the wiring layer 22 is electrically and mechanically connected to the semiconductor element 11.

Heating the second bumps 14 to a extent not exceeding their melting point as shown in FIG. 4 results in increasing, if using an indium/tin alloy as in the case of the present embodiment, a faults percentage at a time of bonding in a rang exceeding both a solid-phase temperature 120° C. and liquid-phase temperature 135° C. This is because, in the temperature range exceeding the aforementioned melting point, the second bumps 14 are already molten, before a connection is achieved between the first bumps 13 and the wiring layer 22, and hence no adequate removal of an oxide film is ensured due to the plastic deformation of the second bumps 14.

In the present embodiment, the semiconductor element 11 was compression-bonded, for 5 seconds, under a pressure of 15 g/pad with the semiconductor element 11 and substrate 21 heated to 110° C. and 60° C., respectively. Since the aforementioned pressure was able to be applied to an extent not exceeding a pressure of 50 g/bump which was used in the wire bonding method and tape automated bonding method, a damage to the semiconductor element 11 and to the substrate 21 was able to be reduced.

Here, in order to obtain an optimum pressure condition, an LSI chip (semiconductor element 11) and glass substrate (substrate 21) for testing were tested for a load and resistance and a faults percentage upon their connection. 99 samples were used in which case electrode pads for LSI chip connection were a 85 $\mu$m square, each, at an interval of 77 $\mu$m. The connection resistance was measured using four lead wires taken out of the glass substrate. A constant current was flowed through the connection site and the current and voltage were measured by a four-terminal method using such lead wires to obtain a connection resistance as R=V/I. The connection resistive value, if exceeding 10 $\Omega$, was judged as being a fault.

The pressure applied was varied in a range of 0.5 to 3 Kg per chip and a connection (bond) was obtained with the LSI chip and glass substrate being heated to 110° C. and 60° C., respectively. It is desirable to heat the substrate side because it is smaller in temperature difference than the LSI chip and smaller in stress than the LSI chip. The bonding time was 5 seconds.

As will be appreciated from FIG. 5, no bonding occurs at a pressure of 0.5 Kg/chip, but almost no bonding fault occurs in a range of 1 to 3 Kg. At that time, an area taken up by a collapsed indium/tin alloy 85 $\mu$m in square configuration is as small as about 100 $\mu$m in square configuration and there is a very small possibility that the adjacent bumps will contact with each other. The connection resistance is below 1 $\Omega$/bump on an average and it has been found that a better connection is obtained. An average value of the connection resistance is low, and a variation is small, over a range of 1.5 to 2 Kg/chip. Since 99 bumps are mounted per chip, a pressure used is 15 to 20 g/bump. Since the load involved is one third that load used in the conventional wire bonding and TAB method, a damage to the LSI chip is less.

The advantages of using, for example, indium, tin, lead and silver as the second bumps are as follows. The solid-phase temperature of the tin/lead alloy is normally as low as 183° C. and, if being connected to a liquid crystal panel (substrate 21) and so on, the bonding temperature can be restricted below 180° C. It is possible to decrease a damage, by a temperature action, to the liquid crystal panel and so on. This advantage makes it possible to mount a drive semiconductor element directly on the liquid crystal panel and hence very effective to obtain a high-density and compact electrical unit using a liquid crystal panel. As the tin/lead alloy is soft, it causes less damage to a bonded structure between the semiconductor element 11 and the substrate 21. Further, it is possible to lower the solid-phase temperature of the alloy using indium and hence to decrease a possible damage due to the soft nature of the alloy per se. Using silver per se or a silver-based material, such as silver palladium and silver platinum, as the conductive wiring material results in a prominent diffusion prevention effect.

In the present embodiment, the state of the bonding (connection) between the second bumps 14 on the semiconductor elements 11 and the wiring layer 22 on the substrate 21 is examined by, for example, a probing method prior to the resin impregnating step shown in FIG. 1C. If, at this time, a fault occurs on the semiconductor element 11 and on the bonding site, the semiconductor element 11 can be readily stripped from the substrate by applying a shearing force of a few hundreds of gf/element to the bonded unit. In the case where the second bumps 14 which are left, by the stripping operation, on the surface of the wiring layer 22 are removed from there with the use of, for example, a solvent, it is possible to reuse the substrate thus stripped. Hence, the faults as set out above are very readily repairable in comparison with the case where the resin used is left on the substrate 21 as in the conventional method.

If no fault is found upon an electrical examination, the resin 15 is impregnated into a clearance between the semiconductor element 11 and the substrate 21 as shown in FIG. 1C. In this case, the resin used includes a thermosetting or photo-setting resin, such as epoxy resin, phenol resin, silicone resin, polyimide, acrylic resin and thermosetting type 1-2 polybutadiene resin. The resin, if being at a viscosity of about 500 cps, is quickly impregnated through a capillary action. The resin, even if being highly viscous, can be readily impregnated into a clearance by warming the resin to a few tens of degrees or by reducing a pressure down to about $10^{-3}$ torr.

According to the present invention, a thermosetting resin was used which was heated to 60° C. for impregnation. The resin can, after being impregnated, be cured under a predetermined condition to obtain a high electrical/mechanical bond of high reliability. At this time, the contact resistance between the wiring layer 22 and the second bumps 14 was, on the average, below 1 Ω/bump and there occurred no fault resulting from the impregnation and curing of the resin. The second bumps (alloy) 14 are formed by directly dipping, or transferring, their materials themselves and the contact resistance is low and of high reliability in comparison with that containing a binder resin as used by, for example, a silver paste.

Test samples were prepared and tests were conducted for their impact shocks at −40° to 100° C. at a cycle of 30 minutes. The impact shock tests were repeated until 300 cycles, the results of which are as shown in FIG. 6B. The contact resistive value after 300 cycles was, on the average, below 1 Ω. Further, a high temperature/humidity test at 70° C. and 90% R.H was conducted for 500 hours, the result of which is as shown in FIG. 6A. The contact resistance after 500 hours was, on the average, below 1 Ω. A small decrease of the contact resistance at the impact shock test is considered to be caused by the shrinkage of the resin. From the overall standpoint, the contact resistance is small and stable.

For comparison, the face-down bonding of the semiconductor element was carried out as will be set forth below. In the same way as in the aforementioned embodiment, an about 100 Å-thick SiO$_2$ film was formed on a 1.1 mm-thick soda-lime glass substrate (as the substrate 21) and a 1000 Å-thick ITO was evaporated on the SiO$_2$ layer. The surface of the resultant structure was electrolessly plated with nickel to form a 5000 Å-thick wiring layer 22. For the semiconductor element 11, on the other hand, gold bumps (first bumps) 13 were formed by a wet bumping method on an aluminum pad (electrode 12). As the second bumps 14, an indium/tin alloy was formed by the dipping method.

Then the semiconductor element 11 was heated to 125° C., a temperature above the melting point (120° C.) of the second bumps 14, and the substrate 21 was maintained at 60° C. In this state, the semiconductor element 11 was compression bonded to the substrate 21 under a pressure of 15 g/pad for 5 seconds at the time of bonding. Of 99 pads, 30 pads (about 30%) were defective as shown in FIG. 4. It has been found that no adequate reliability is obtained when the semiconductor element is thus bonded to the substrate at the temperature above the melting point of the second bumps 14.

According to the present invention, the bonding of the first bumps 13 o the semiconductor element to the wiring layer 22 on the substrate 21 is done at the temperature below the melting point of the second bump 14. In this case, an oxide film on the bumps 14 per se and wiring layer 22, can be removed through the plastic deformation of the bumps 14. It is thus possible to obtain an electrical/mechanical bond. It is also possible to obtain a bond of high reliability resulting from the impregnation of the resin 15. As the electrical examination is performed prior to the filling of the resin 15, repairs can be readily made when faults occur on the device thus obtained. Further, it is also possible to achieve a high production at a shorter time period under a position-aligned mechanism-equipped mounter. It is further possible to perform a mounting step readily at lower cost because the bond can be achieved with the resin impregnated and cured.

A semiconductor device according to a second embodiment of the present invention will be explained below. FIGS. 7A to 7C are cross-sectional views showing a second embodiment of the present invention. The same reference numerals are employed in FIGS. 7A to 7C to designate a part or an element corresponding to that shown in FIGS. 1A to 1C and further explanation is, therefore, omitted for brevity's sake.

First, in the same way as in the preceding embodiment, Au bumps 13 were formed as first bumps on an electrode 12 of a semiconductor element 11. Forming the Au bumps 13 can be achieved, by the wet bumping method or the transfer bumping method, as already set forth above. In the present embodiment, first bumps 13 were formed by the wet bumping method and 99 bumps were formed as a 85 μm × 85 μm × 18±2 μm high, each, at a minimum pitch of 130 μm.

Then, as shown in FIGS. 7A and 7B, second bumps 14 were formed on the first bumps 13 of the semiconductor element 11. That is, a resin-series flux was coated on the surface of the second element 11 and, as shown in FIG. 7A, the surface of the semiconductor element 11, that is, the first bumps 13, was dipped into a molten metal 52 held in a container 52. An indium/tin alloy was used for the molten metal 52, in this case, at a dipping temperature of 183° C. for a dipping time period of 3 sec. Then, as shown in FIG. 7B, the first bumps 13 on the semiconductor element 11 were lifted off the molten metal 52 and the flux deposited on the surface of the semiconductor element 11 was washed away with an organic solvent. By so doing, second bulbous bumps 14 were formed on the first bumps 13.

Then, as shown in FIG. 7C, the substrate 21 was placed on a support base 32 and the bumps 13 and 14 on the electrode 12 of the semiconductor element 11 were placed, in that order, on the wiring layer 22 on the substrate 21 with these bumps aligned with the wiring layer 22. In this state, the semiconductor element 11 was pressed by a heating head 31 against the substrate 21 and, at the same time, the second bumps 14 were heated to an extent not exceeding their melting point. If, at this time, the heating and compressing conditions are properly set, then the second bump 14 are deposited around the side wall of the first bumps 14. By so doing, the first bumps 13 were bonded to the wiring layer 22 by the second bumps 14 which are formed of an indium/tin alloy.

After the completion of a heating and compressing step, a thermosetting resin 15 was impregnated into a clearance between the semiconductor element 11 and the substrate 21, as shown in FIG. 1C, and the mounting of the semiconductor element 11 on the substrate 21 is achieved, by curing the resin upon heating, to obtain a face-down bonding.

According to the present embodiment, as set forth above in connection with the first embodiment, the first bumps 13 on the semiconductor element 11 are electrically and mechanically bonded to the wiring layer 22 by means of the second bumps 14. Impregnating the resin 15 ensures a bond of high reliability and can also achieve a ready repair in the event of faults. It is thus possible to improve the productivity of a semi-conductor device at low cost. Further, since the second bumps 14 are so formed as to be deposited around the side wall of the first bumps 13, a more stable bond can be achieved between the first nd second bumps 14, thus reducing the contact resistance.

The present invention is not restricted to the aforementioned embodiment. Various changes and modifications are made without departing from the spirit and scope of the present invention.

What is claimed is:

1. A method for manufacturing a semiconductor device including a substrate having a wiring layer formed on its major surface and a semiconductor element having an electrode formed on its major surface, and the semiconductor element being mounted on the substrate so that the major surface of the semiconductor element faces the major surface of the substrate, which comprises the steps of:

forming a bump on said electrode;

electrically and mechanically connecting said bump and said wiring layer by pressing said semiconductor element against said substrate so that said bump is brought into contact with said wiring layer, while heating said bump to a plastic deformable temperature lower than the melting point of said bump; and impregnating a gap between said semiconductor element and said substrate with a resin having a photo-setting or thermosetting property, and hardening said resin.

2. A method according to claim 1, wherein said bump forming step comprises:

forming a first bump on said electrode, said first bump being made of at least one of gold, copper, nickel, and solder; and forming a second bump on said first bump, said second bump being made of one selected from the group consisting of indium, tin, lead, silver and an alloy made of at least two thereof.

3. A method according to claim 1, wherein said bump forming step comprises:

forming a first bump on said electrode, said first bump being made of gold; and forming a second bump on said first bump, said second bump being made of an alloy consisting of indium and tin.

4. A method according to claim 2, wherein said second bump forming step comprises:

dipping said first bump in a molten metal; and lifting said first bump off said molten metal to form bulbous metal, as said second bump, on said first bump.

5. A method according to claim 2, wherein said second bump-forming step comprises:

heating said first bump;

pressing said first bump against a sheet-like metal member; and separating said sheet-like member from said first bump, to form pin-like metal, as said second bump, on said first bump.

6. A method according to claim 1, wherein said impregnating step further comprises lowering a viscosity of said resin by at least one of heating said resin and placing said semiconductor element and said substrate under a reduced pressure.

7. A method according to claim 1, wherein said connecting step further comprises plastically deforming said heated bump and thereby removing an oxide film on said bump and an oxide film on said wiring layer.

* * * * *